United States Patent
Guo et al.

(10) Patent No.: US 10,305,425 B2
(45) Date of Patent: May 28, 2019

(54) RC OSCILLATOR THAT USES THERMOMETER CODES TO SELECT A SUB-ARRAY AND BINARY CODES TO SELECT CAPACITORS OR RESISTORS WITHIN A SUB-ARRAY FOR LINEAR AND MONOTONIC TUNING

(71) Applicant: Hong Kong Applied Science and Technology Research Institute Company, Limited, Hong Kong (HK)

(72) Inventors: Huimin Guo, Hong Kong (HK); Zhongliang Zhou, Hong Kong (HK); Yat Tung Lai, Hong Kong (HK)

(73) Assignee: Hong Kong Applied Science and Technology Research Institute Company, Limited, Hong Kong (HK)

( * ) Notice: Subject to any disclaimer, the term of this patent is extended or adjusted under 35 U.S.C. 154(b) by 85 days.

(21) Appl. No.: 15/796,961

(22) Filed: Oct. 30, 2017

(65) Prior Publication Data
US 2019/0131929 A1 May 2, 2019

(51) Int. Cl.
*H03B 5/24* (2006.01)
*H03K 3/0231* (2006.01)
*H03B 5/04* (2006.01)

(52) U.S. Cl.
CPC ............... *H03B 5/04* (2013.01); *H03B 5/24* (2013.01); *H03K 3/0231* (2013.01);
(Continued)

(58) Field of Classification Search
CPC .......... H03B 5/20; H03B 5/24; H03B 5/1262; H03B 5/1265; H03B 2200/005;
(Continued)

(56) References Cited

U.S. PATENT DOCUMENTS

| 5,084,685 A | 1/1992 | Moller et al. |
| 5,180,991 A | 1/1993 | Takashima |

(Continued)

FOREIGN PATENT DOCUMENTS

| CN | 1146099 A | 3/1997 |
| CN | 103294093 A | 9/2013 |

OTHER PUBLICATIONS

ISR and Written Opinion, PCT/CN2017/109391, dated Jun. 27, 2018.

*Primary Examiner* — Levi Gannon
(74) *Attorney, Agent, or Firm* — Stuart T. Auvinen; gPatent LLC

(57) ABSTRACT

An RC oscillator has a variable capacitor that sets the output frequency. The variable capacitor has m binary-weighted switched capacitor arrays, and each binary-weighted switched capacitor array has binary-weighted capacitors. p binary bits are decoded into an m-bit thermometer code that selects one of the m binary-weighted switched capacitor arrays to use n binary bits to switch its binary-weighted capacitors. Other binary-weighted switched capacitor arrays have all their capacitors switched on, or all their capacitors switched off by the thermometer code. The smallest or unit capacitance of each binary-weighted switched capacitor array is adjusted to compensate for the non-linear reciprocal relationship of frequency being proportional to 1/RC. The unit capacitance is increased for each successive binary-weighted switched capacitor array to reset to the ideal linear relationship of the (p,n)-bit code to frequency.

20 Claims, 12 Drawing Sheets

(52) U.S. Cl.
CPC .............. *H03B 2200/005* (2013.01); *H03B 2201/0208* (2013.01); *H03B 2201/0266* (2013.01)

(58) Field of Classification Search
CPC ...... H03B 2201/011; H03B 2201/0208; H03B 2201/0266; H03K 3/0231; H03K 4/12; H03K 4/50
USPC ........................ 331/36 C, 111, 143, 177 V
See application file for complete search history.

(56) References Cited

U.S. PATENT DOCUMENTS

| | | | | |
|---|---|---|---|---|
| 5,585,765 | A * | 12/1996 | O'Shaughnessy | G05F 3/247 327/541 |
| 6,262,603 | B1 * | 7/2001 | Mohan | H03B 5/20 327/518 |
| 6,326,859 | B1 | 12/2001 | Goldman et al. | |
| 6,417,737 | B1 * | 7/2002 | Moloudi | H03B 21/01 330/301 |
| 6,496,131 | B2 | 12/2002 | Yoshinaga | |
| 7,477,098 | B2 * | 1/2009 | Dharmalinggam | H03H 11/1291 327/552 |
| 7,583,154 | B1 | 9/2009 | Kizziar | |
| 7,986,181 | B2 * | 7/2011 | Confalonieri | H03H 1/02 327/337 |
| 8,390,354 | B2 | 3/2013 | Vig et al. | |
| 8,390,384 | B1 | 3/2013 | Daryanani et al. | |
| 8,552,797 | B2 | 10/2013 | Lin | |
| 9,362,882 | B1 | 6/2016 | Madan et al. | |
| 9,503,017 | B1 | 11/2016 | Easter et al. | |
| 2006/0170511 | A1 * | 8/2006 | Dunworth | H03B 5/1243 331/177 V |
| 2009/0302958 | A1 | 12/2009 | Sakurai et al. | |

* cited by examiner

RC OSCILLATOR THAT USES THERMOMETER CODES TO SELECT A SUB-ARRAY AND BINARY CODES TO SELECT CAPACITORS OR RESISTORS WITHIN A SUB-ARRAY FOR LINEAR AND MONOTONIC TUNING

FIELD OF THE INVENTION

This invention relates to variable oscillators, and more particularly to a non-linear variable capacitor for output frequency linearity.

BACKGROUND OF THE INVENTION

Synchronous portions of Integrated Circuits (IC's) require one or more clocks to sequence state changes and signal generation. An oscillator can generate one or more of these required clocks. An external crystal can be connected to an internal oscillator circuit to generate a very precise clock. However, external crystals are expensive, and two pins are required to connect to the external crystal. The entire oscillator can be external to the IC, but these tend to be even more expensive.

An internal oscillator may have a resistor and capacitor that create an RC time constant delay that sets the frequency of oscillation. No external crystals are needed. However, accuracy may be problematic due to variations in temperature, process, and circuit design.

The frequency of oscillation generated by an internal oscillator circuits may be variable or tunable. A variable resistor or a variable capacitor may be used for the RC time constant in the circuit. As the capacitance or resistance is increased, the RC time constant increases and the delay and oscillation period increase. The frequency thus decreases. Typically, the oscillator frequency is proportional to 1/RC. This frequency is also dependent on the supply voltage, temperature, and semiconductor manufacturing process.

FIG. 1 shows a prior-art oscillator. Current source 14 charges capacitor 16. Current source 14 may include a voltage-to-current converter that uses a resistance R when charging capacitor 16, providing a RC time constant. Once capacitor 16 is sufficiently charged, a high signal is detected on the non-inverting (+) input of comparator 12 compared to reference voltage VREF applied to the inverting (−) input of comparator 12. Then comparator 12 drives its output FOUT high, turning on transistor 18 and discharging capacitor 16. Once the voltage across capacitor 16 falls below VREF, comparator 12 toggles FOUT low, turning off transistor 18 and allowing the charging cycle to be repeated.

Capacitor 16 can be replaced with a variable capacitor. One common variable capacitor has many binary-weighted capacitors in parallel, each with a switch to connect or disconnect that particular binary-weighted capacitor. A binary code can be applied to the switches, producing a total capacitance that is a binary weight corresponding to the binary code currently applied to the switches.

FIG. 2 is a graph showing oscillator frequency as a function of the binary code applied to an array of switched binary-weighted capacitors. The binary code increases linearly in binary increments of one, such as 1, 2, 3, 4, 5, 6, 7, 8, 9, . . . 15, so the total capacitance also increases in increments of the smallest or unit capacitance C, such as C, 2C, 3C. 4C. 5C, 6C, . . . 15C. However, since the frequency is proportional to the reciprocal of capacitance, (1/RC), the output frequency decreases along the path of reciprocal curve 104. Although the total capacitance and the capacitor binary codes are increasing linearly, the frequency does not increase in a linear fashion such as shown by ideal linear line 102.

The tuning step or increments of frequency adjustment is not linear. Increasing the binary code by one, and adding one unit capacitance, produces a much larger decrease in frequency for low binary values on the left side of the graph, than for high binary values on the right side of the graph. Curve 104 is very steep on the left, producing large changes in frequency per unit capacitance change, but nearly flat on the right, producing very little change in frequency per unit capacitance change.

This non-linearity in frequency response is undesirable. Binary codes for desired frequencies can be pre-calculated and stored on-chip, but adjustments such as to compensate for temperature and process variations may require trial and error and repeated attempts and be difficult to compensate for.

Using other codes, such as gray code or thermometer code, would likewise have the limitation of binary increments or increments that are multiples of binary values. However, binary-weighted switched capacitor arrays are widely used today.

What is desired is a more uniform frequency-tuning step for a variable capacitor. An on-chip RC oscillator with a variable capacitor that is not purely binary weighted is desirable. An oscillator that is pre-compensated for the non-linear reciprocal relationship of capacitance to frequency is desirable.

DETAILED DESCRIPTION

The present invention relates to an improvement in variable-capacitance oscillators. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have discovered that the variable capacitor can be divided into several binary-switched capacitor arrays that each have a different unit capacitance. Thus the increment of capacitance added in each capacitor array differs. The exact value of the unit capacitance is selected to compensate for the non-linear reciprocal relationship of capacitance and frequency, 1/RC. Each capacitor array can adjust its total capacitance using a binary code to select binary-weighted capacitors within that array. However, each successive capacitor array starts with a successively higher value of its unit capacitance. A thermometer code selects which of the capacitor arrays are connected.

Figure 3:
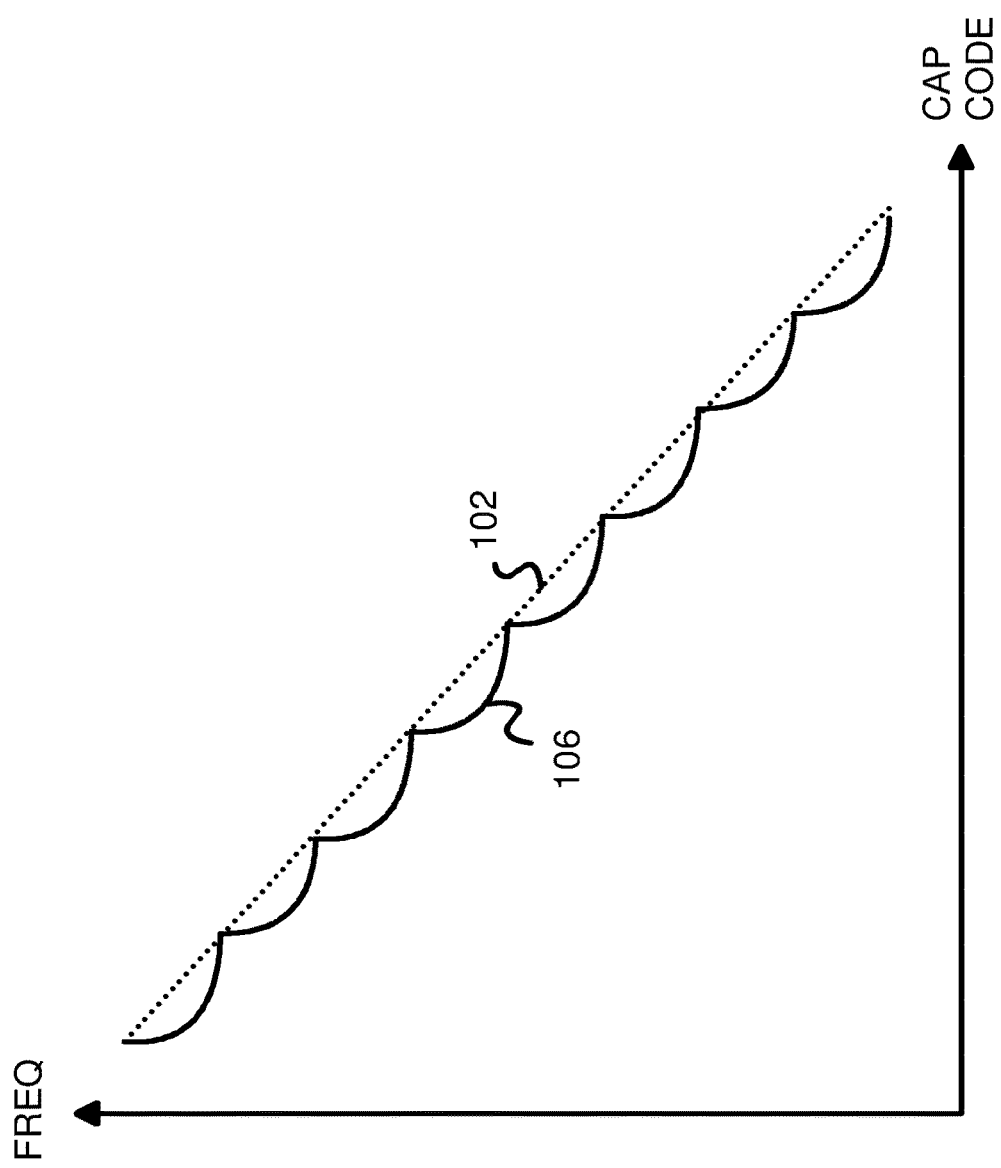
FIG. 3 is a graph showing a more linear relationship of the applied capacitor code and the resulting oscillator frequency.

FIG. 3 is a graph showing a more linear relationship of the applied capacitor code and the resulting oscillator frequency. In this example, there are 8 capacitor arrays. The upper p bits of a (p,n) binary code are decoded into an m-bit thermometer code, where $2^p$ is m. The m-bit thermometer code selects which of these 8 capacitor arrays are switched on. Each of the 8 capacitor arrays is a binary-weighted capacitor array that receives the lower n binary bits. However, the unit capacitance of each of the 8 capacitor arrays is different. The unit capacitance of a particular array is adjusted so that the capacitor array initially intersects ideal linear line 102. Thus each of the 8 capacitor arrays initially has an ideal capacitance value, a capacitance value falling along line 102.

Figure 1:
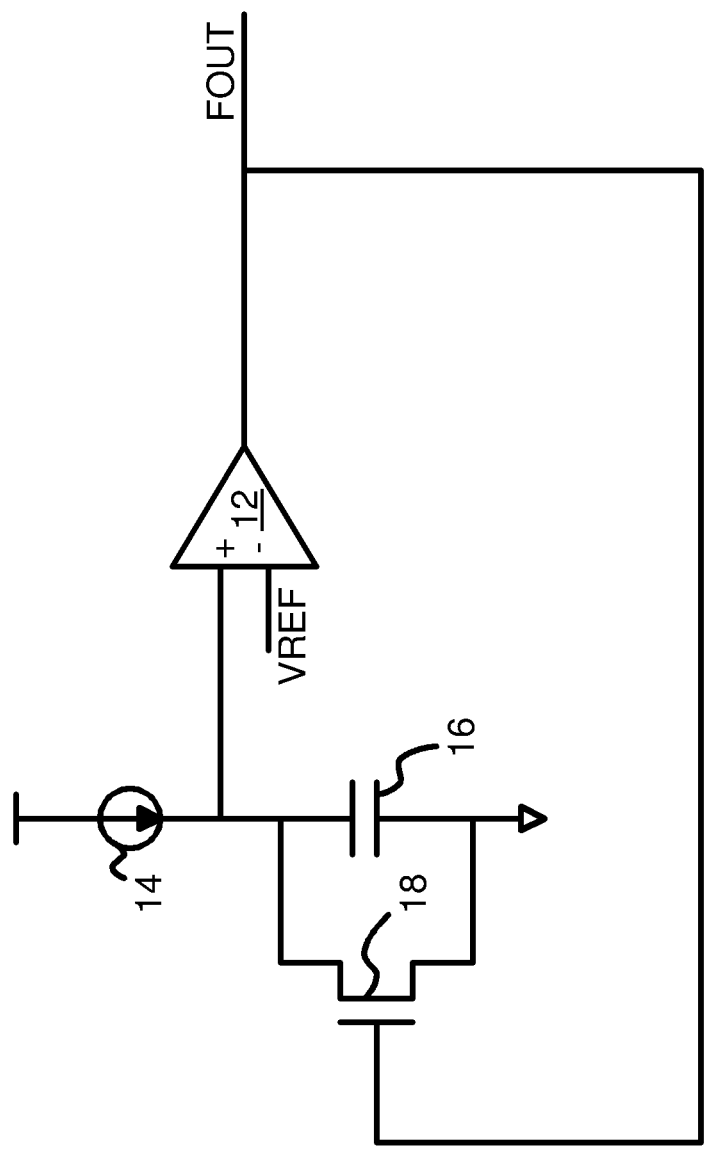
FIG. 1 shows a prior-art oscillator.
Figure 2:
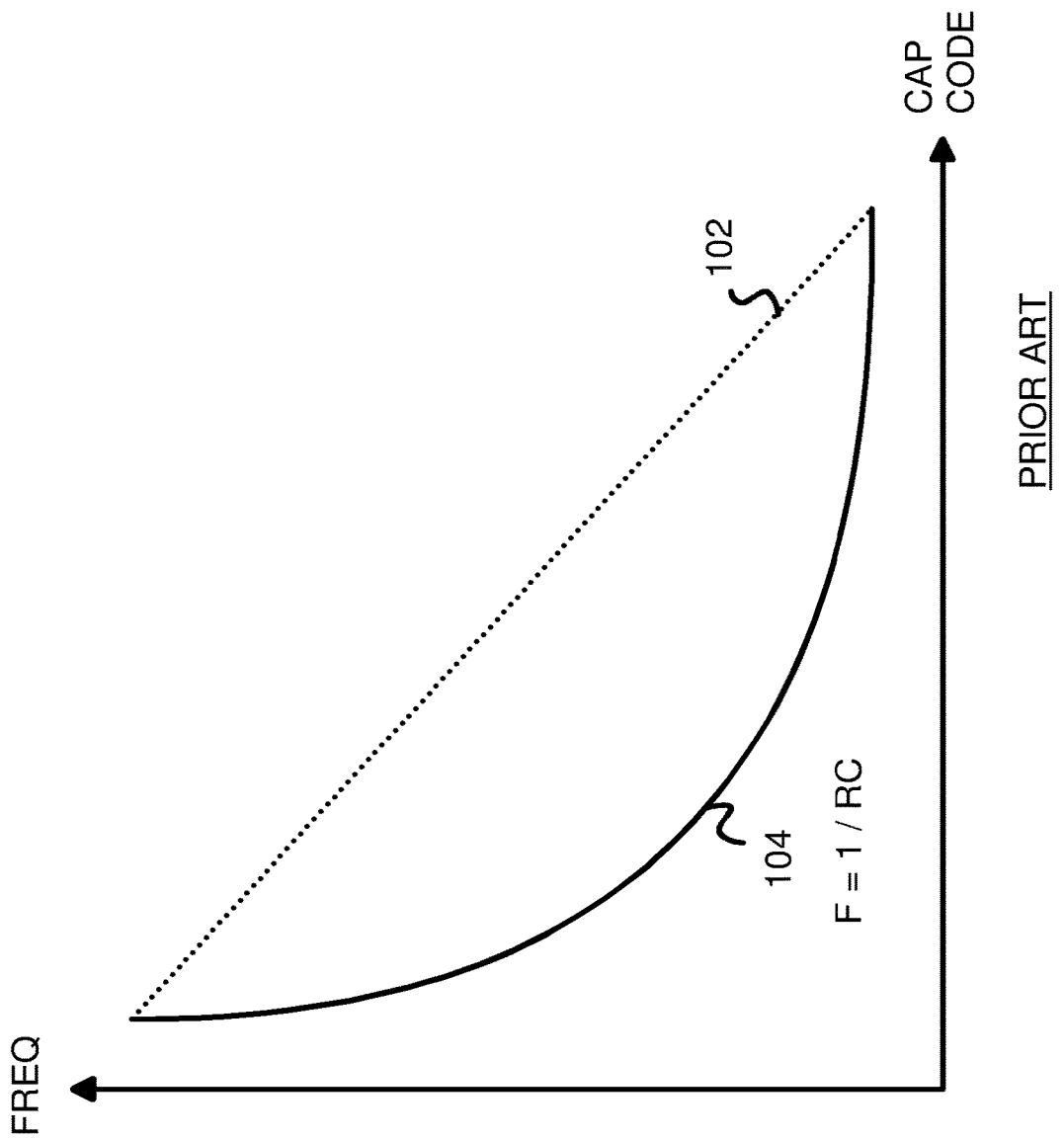
FIG. 2 is a graph showing oscillator frequency as a function of the binary code applied to an array of switched binary-weighted capacitors.

Since each of the 8 capacitor arrays are binary weighted, as the binary code (p,n) applied to an array is increased, the non-linear reciprocal relationship causes curve 106 to bend or curve away from ideal linear line 102. However, since the unit capacitance is reset for each new capacitor array, and there are 8 capacitor arrays, curve 106 stays much closer to ideal linear line 102 than did curve 104 of FIG. 2 using one big capacitor array.

Figure 4:
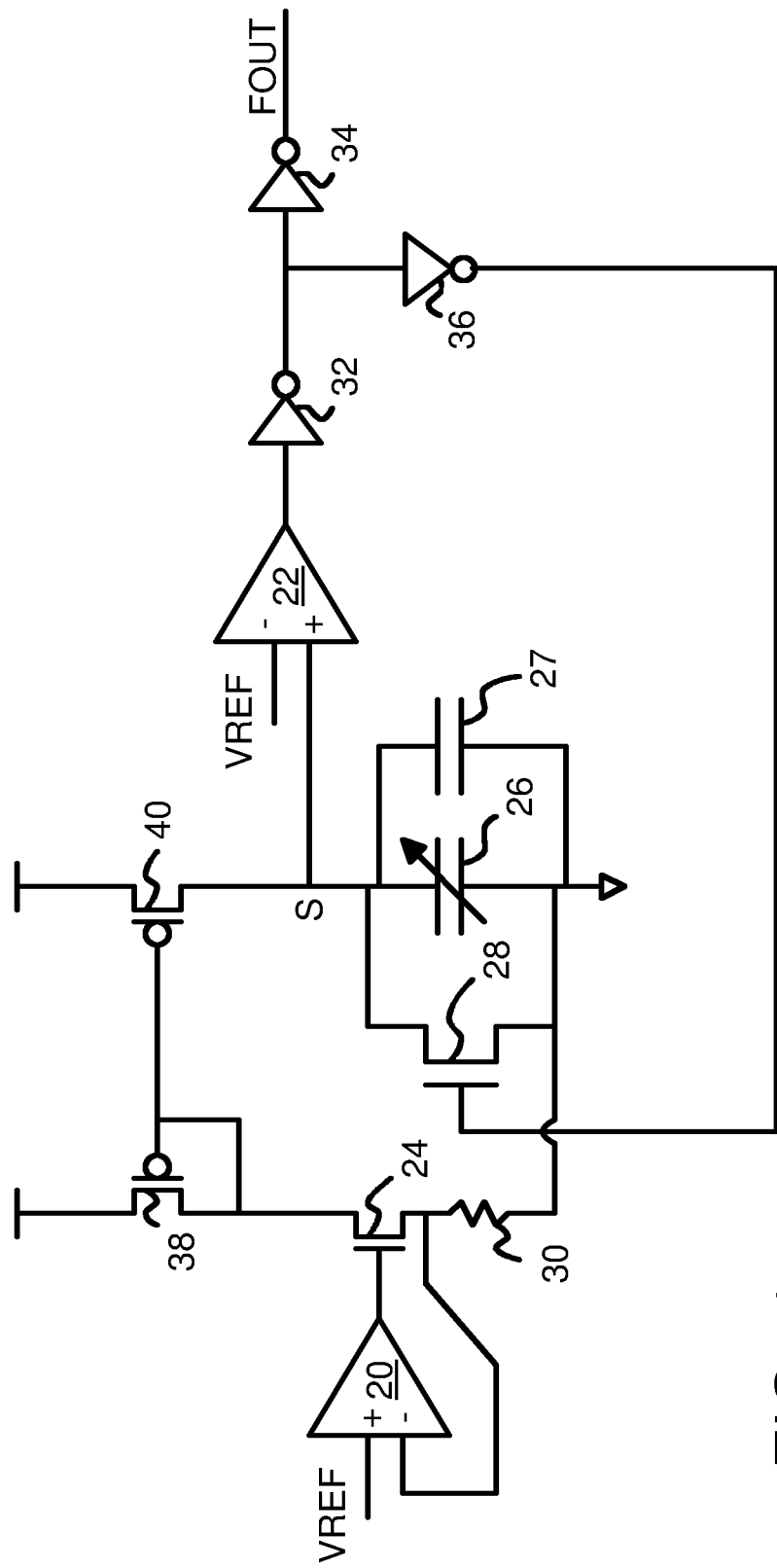
FIG. 4 is a schematic of a reciprocal-compensating oscillator.

FIG. 4 is a schematic of a reciprocal-compensating oscillator. Variable capacitor 26 is composed of several binary-switched capacitor arrays that each have their unit capacitance reset as shown in FIG. 3. Endpoint capacitor 27 is a fixed capacitor that sets an initial capacitance value for the beginning of the frequency tuning range. Since endpoint capacitor 27 and variable capacitor 26 are in parallel, their capacitances are effectively summed. P-channel transistor 40 acts as a current source to charge variable capacitor 26 and endpoint capacitor 27, allowing summing node S to rise in voltage until it surpasses reference voltage VREF, causing comparator 22 to toggle and drive FOUT high through inverters 32, 34. The gate of n-channel transistor 28 is also driven high through inverter 36, turning n-channel transistor 28 on and discharging variable capacitor 26 and endpoint capacitor 27. Once the voltage of summing node S falls below VREF, comparator 22 toggles FOUT low, turning off n-channel transistor 28 and allowing charging to resume.

The gate bias voltage of p-channel transistor 40 is set by the gate and drain connection of p-channel transistor 38, which has current sunk through n-channel transistor 24 and resistor 30. Op amp 20 compares the voltage across resistor 30 to VREF to provide feedback to the gate of n-channel transistor 24. This provides some temperature and process compensation. A different or the same value of VREF may be used for op amp 20 and for comparator 22.

Figure 5:
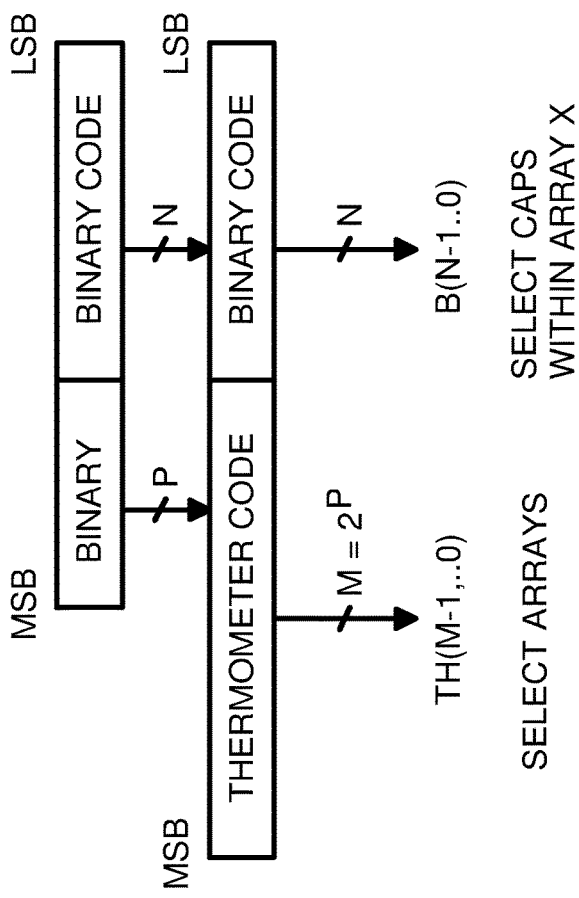
FIG. 5 highlights the capacitor codeword being split into thermometer MSB and binary LSB sections.

FIG. 5 highlights the capacitor codeword being split into thermometer MSB and binary LSB sections. The Most-Significant-Bits (MSBs) are used to select which of the capacitor arrays are enabled. An m-bit thermometer code can be decoded from fewer binary bits, such as p binary bits where $2^p$=m, or can be directly generated by control or tuning logic. These bits select which one of the m capacitor arrays are enabled.

Capacitor arrays having their thermometer bit being a 0 are turned off, with all capacitors disconnected, while capacitor arrays having their thermometer bit being a 1 have one or more of their capacitors turned on. The leading 1 in the thermometer code corresponds to the selected capacitor array. Only the selected capacitor array receives the LSB bits. The trailing 1 capacitor arrays that are turned on, but are not the selected capacitor array, have all their capacitors turned on, and ignore the LSB's.

The Least-Significant-Bits (LSBs) from the capacitor code are applied to the selected capacitor array as an n-bit binary code. These LSB's select the binary-weighted capacitors within that selected capacitor array. The LSB binary code is only applied to the selected capacitor array, which is the array where the thermometer code is changing from 0 to 1.

Figure 6:
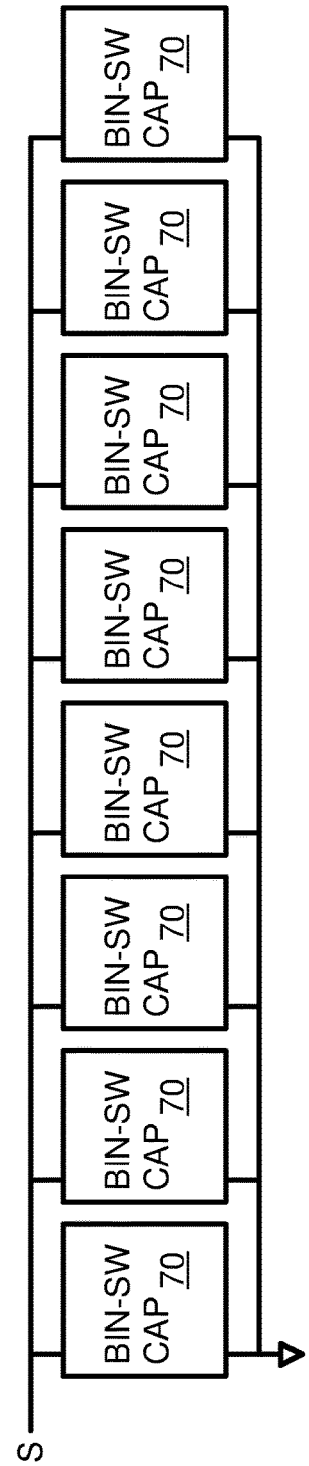
FIG. 6 shows a variable capacitor that has 8 binary-weighted switched capacitor arrays.

FIG. 6 shows a variable capacitor that has 8 binary-weighted switched capacitor arrays. Summing node S (FIG. 4) connects to each of binary-weighted switched capacitor array 70. The thermometer code determines which of the eight binary-weighted switched capacitor array 70 are "on" and have all their capacitors connected to summing node S, and which of binary-weighted switched capacitor array 70 are "off" and have none of their capacitors connected to summing node S. The thermometer code also determines which of binary-weighted switched capacitor array 70 is the selected array that receives the binary code and has some but not all of its capacitors connected to summing node S.

The "off" arrays have a corresponding thermometer code bit of 0. The leading 1 of the thermometer code identifies the "selected" array that uses the binary code to select some of its capacitors. The "on" arrays have a corresponding thermometer code bit of 1 but are not the leading one.

Figure 7:
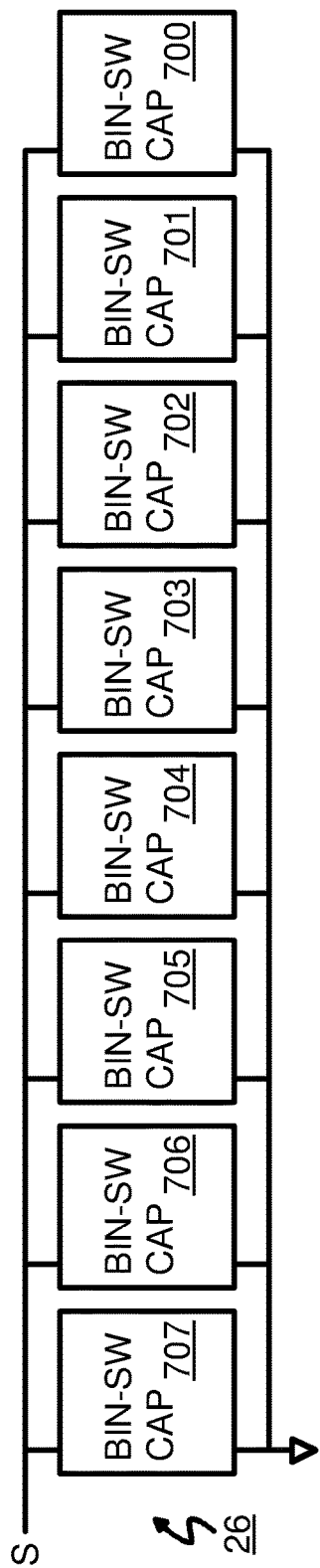
FIG. 7 shows the thermometer code selecting binary-weighted switched capacitor arrays.

FIG. 7 shows the thermometer code selecting binary-weighted switched capacitor arrays. In this example variable capacitor 26 has 8 binary-weighted switched capacitor arrays 700, 701, 702, 703, . . . 707. Binary-weighted switched capacitor array 707 is the most-significant and is controlled by the MSB of the thermometer code, TH7, while binary-weighted switched capacitor array 700 is the least-significant and is controlled by the LSB of the thermometer code, TH0.

The leading 1 of the thermometer code determines the selected capacitor array X. For example, the thermometer code 0000_0111 has TH2 as the leading 1, so binary-weighted switched capacitor array 702 is the selected array X. In this example, TH1 and TH0 are also 1, so binary-weighted switched capacitor arrays 701, 700 are "on" capacitor arrays that have all of their switched capacitors connected to summing node S. Binary-weighted switched capacitor arrays 701, 700 ignore the binary code. Only selected binary-weighted switched capacitor array 702 acts on the binary code. Other binary-weighted switched capacitor arrays 707, 706, . . . 704, 703 have thermometer code bits that are 0, so these are "off" arrays and have no capacitors connected to summing node S. The total capacitance is the full capacitance of all capacitors in binary-weighted switched capacitor arrays 701, 700, plus the capacitors enabled by the binary code word LSB's within selected binary-weighted switched capacitor array 702.

In another example, thermometer code word 0001_1111 has TH4 as the leading 1, so binary-weighted switched capacitor array 704 receives the binary LSB's and is partially on, with some capacitors enabled and other capacitors disabled by the binary code. Binary-weighted switched capacitor arrays 707, 706, 705 are "off" and have no capacitors enabled. Binary-weighted switched capacitor arrays 703, 702, 701, 700 are "on" and have all of their binary-weighted capacitors connected to summing node S. These "on" arrays ignore the binary code word.

Figure 8:
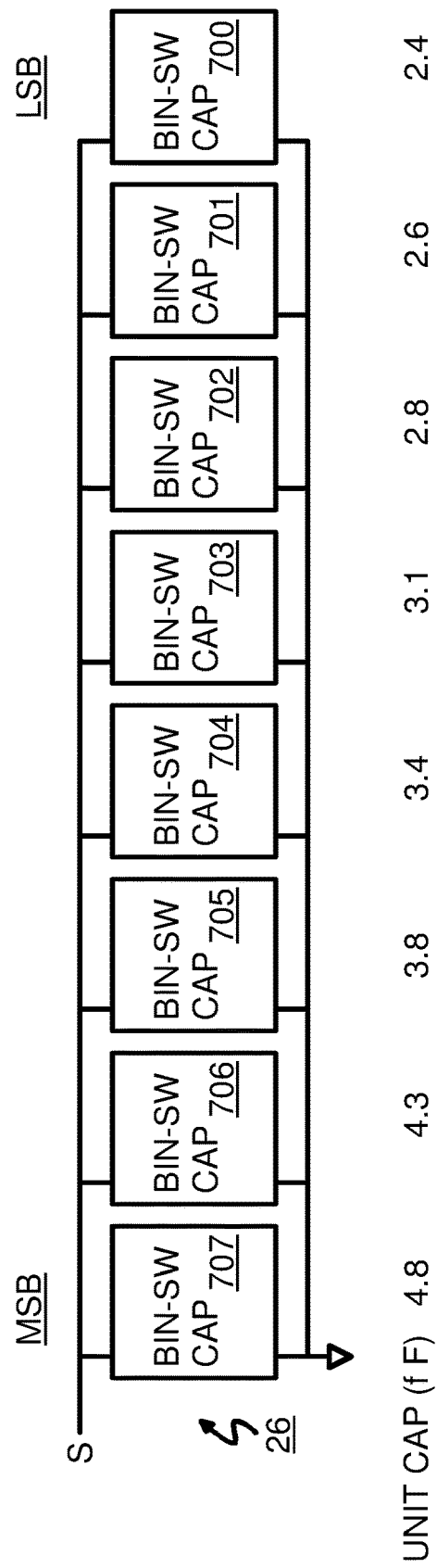
FIG. 8 shows that the unit capacitances have different values in each of the binary-weighted switched capacitor arrays.

FIG. 8 shows that the unit capacitances have different values in each of the binary-weighted switched capacitor arrays. The LSB of the thermometer code controls binary-weighted switched capacitor array 700. The unit capacitance of binary-weighted switched capacitor array 700 is 2.4 femto-farads (fF). Switched capacitors in binary-weighted switched capacitor array 700 have values C, 2C, 4C, 8C, . . . of 2.4, 4.8, 9.6, 19.2, . . . fF.

The unit capacitance of second binary-weighted switched capacitor array 701 is 2.6 femto-farads (fF). Switched capacitors in binary-weighted switched capacitor array 701 have values C, 2C, 4C, 8C, . . . of 2.6, 5.2, 10.4, 20.8, . . . fF.

The MSB of the thermometer code controls binary-weighted switched capacitor array 707. The unit capacitance of binary-weighted switched capacitor array 707 is 4.8 femto-farads (fF). Switched capacitors in binary-weighted switched capacitor array 707 have values C, 2C, 4C, 8C, . . . of 4.8, 9.6, 19.2, 38.4, . . . fF.

Each step in the binary code word adds twice as much capacitance for MSB binary-weighted switched capacitor array 707 than for LSB binary-weighted switched capacitor array 700.

The unit capacitances of binary-weighted switched capacitor arrays 700, 701, 702, . . . 707 start at 2.4 fF, then 2.6, 2.8, 3.1, 3.4, 3.8, 4.3, and finally 4.8 fF. Note that these values do not increase linearly. The unit capacitances increase by approximately 0.2 fF for the first three arrays, then by 0.3 fF for the next 2 arrays, then by 0.4 fF, then by 0.5 fF for the last 2 arrays.

The unit capacitances may be calculated by the formula:

$$UC=[1/(R*F1)-1/(R*F2)]/2^n,$$

where R is an effective resistance to charge the capacitors, such as the scaled resistance of resistor 30 when a voltage-to-current converter is used, and n is a number of binary bits in the binary code. For any particular binary-weighted switched capacitor array 70, F1 is a minimum output frequency generated and F2 is a maximum output frequency generated when that particular binary-weighted switched capacitor array cell is identified by a leading 1 bit in the thermometer code.

The total desired frequency range is divided into m equal frequency intervals, with F1 and F2 being the endpoints of a frequency range for a particular one of the m binary-weighted switched capacitor arrays 70. F1 is smaller than F2.

The unit capacitances can be approximate, such as within 10% of a value calculated by the formula. A more detailed example of the calculations is found at the end of the description in the Alternate Embodiments section.

Figure 9:
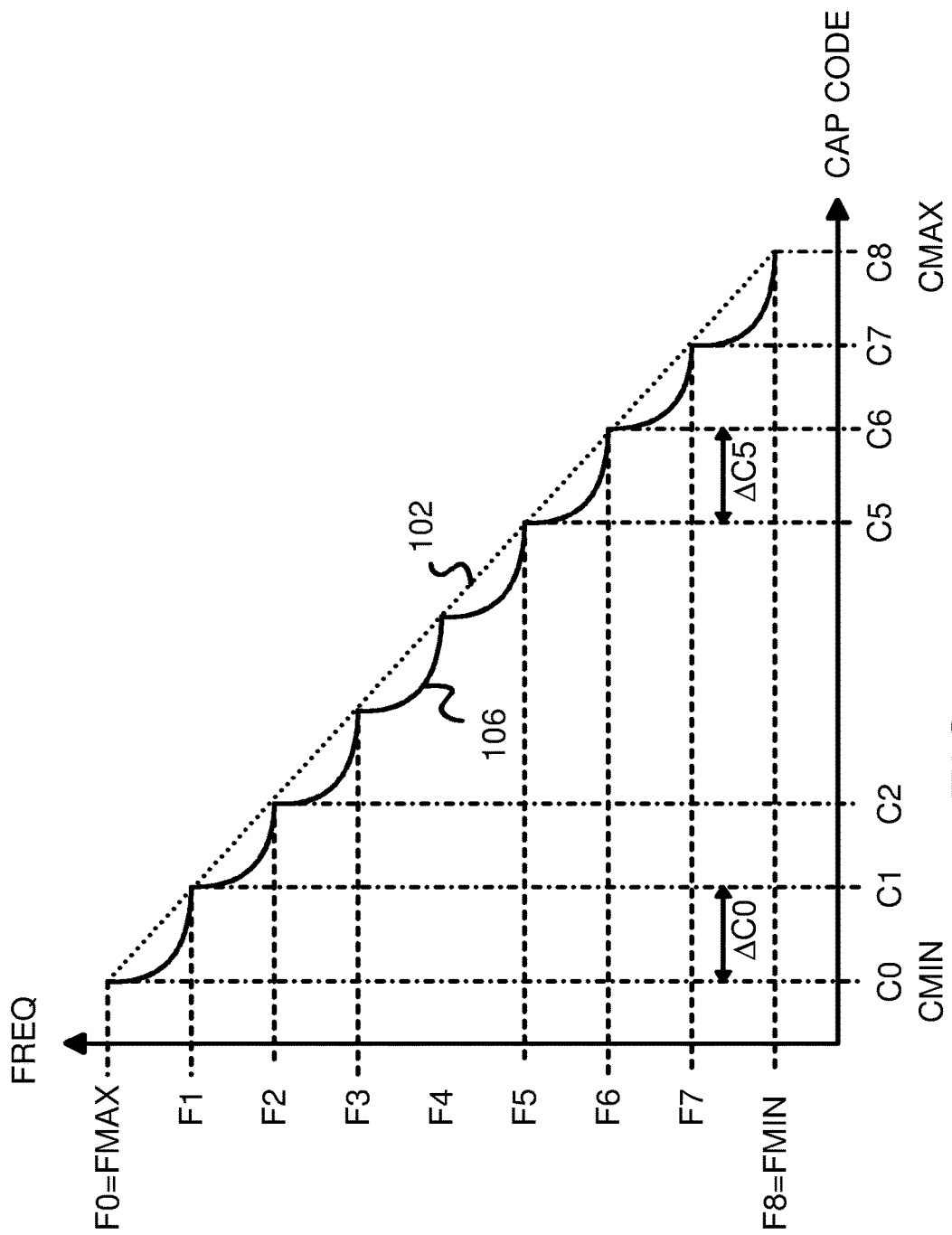
FIG. 9 is a graph showing several binary-weighted switched capacitor arrays that each have different unit capacitances.

FIG. 9 is a graph showing several binary-weighted switched capacitor arrays that each have different unit capacitances. A (p,n)-bit binary code has the upper p binary bits decoded into an m-bit thermometer code, where $2^p=m$. In this example, there are m=8 binary-weighted switched capacitor arrays 70, so the frequency range is divided evenly into eight frequency ranges between F0 (FMAX) to F7 (FMIN). The 8 smaller curved shapes within curve 106 for each of the eight frequency ranges is caused by the binary differences of selectable capacitors within each binary-weighted switched capacitor array 70.

Each of the adjustments in unit capacitances has the effect of bringing curve 106 back to the vicinity of ideal linear line 102. The non-linear reciprocal relationship of capacitance and frequency is compensated for by adjusting the unit capacitance of each successive binary-weighted switched capacitor array 70.

Although the frequency differences among F0, F1, F2, F3, . . . F7 are equal, the actual capacitance differences are not equal. While the capacitor codes are still equally spaced, the capacitance values differ because of the different unit capacitances. For example, although the change in capacitor codes (x-axis) is the same across the frequency range, $\Delta C5$ is much larger than $\Delta C0$, because unit capacitance C0 is 2.4 fF while unit capacitance C5 is 3.8 fF for the example of FIG. 8. Thus $\Delta C5$ would be 3.8/2.4 or 1.6 times greater than $\Delta C0$.

Figure 10:
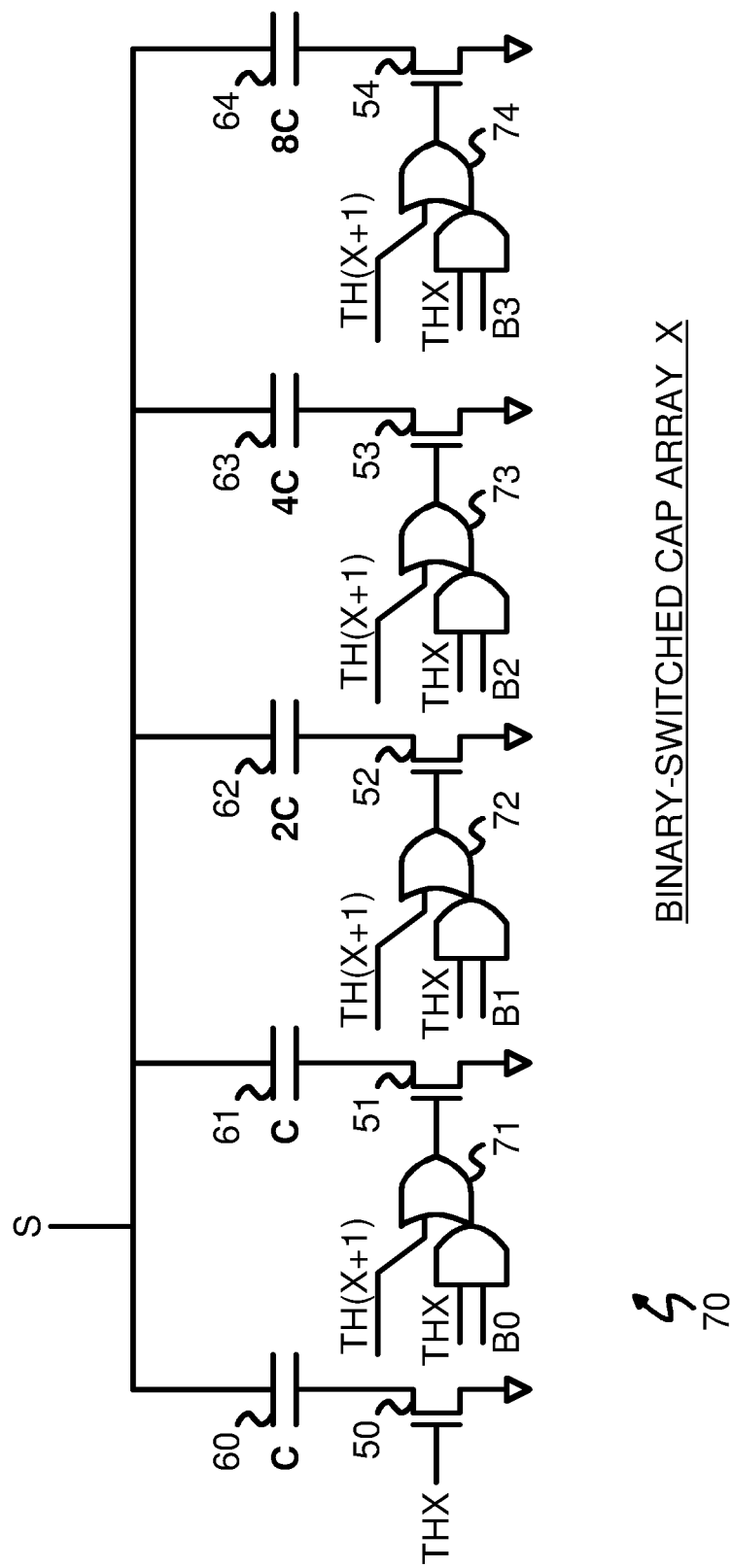
FIG. 10 is a detailed diagram of a binary-weighted switched capacitor array.

FIG. 10 is a detailed diagram of a binary-weighted switched capacitor array. Binary-weighted switched capacitor array 70 has binary-weighted capacitors 60, 61, 62, 63, 64 that are switched by transistors 50, 51, 52, 53, 54 connect in parallel to summing node S. The weights of binary-weighted capacitors 60, 61, 62, 63, 64 increase by power of two of the unit capacitance: C, C, 2C, 4C, 8C. The binary word, which is the LSB of the overall capacitance code word, has binary bits B3, B2, B1, B0 that are applied as inputs to AND-OR gates 74, 73, 72, 71, respectively. This is a 4-bit binary example.

When the current binary-weighted switched capacitor array 70 is the selected cell X, then the leading 1 in the thermometer code is THX, while TH(X+1) is 0 and TH(X−1) is 1. The 0 value for TH(X+1) that is input to the OR portion of AND-OR gates 74, 73, 72, 71 enables the output of the AND portion to pass through. The 1 value for THX allows the binary code of binary bits B3, B2, B1, B0 to pass through AND-OR gates 74, 73, 72, 71 to the gates of n-channel transistors 54, 53, 53, 51 to enable binary-weighted capacitors 60, 61, 62, 63, 64. Thus the total amount of capacitance that is enabled for cell X varies and is controlled by the binary code.

When the thermometer code bit THX is 0, then the binary-weighted switched capacitor array 70 is an "off" cell. THX low turns off transistor 50, disconnecting capacitor 60. THX low also drives the AND portions of AND-OR gates 74, 73, 72, 71 low. When THX is 0, then THX+1 must also be 0 for any positive thermometer code, since there cannot be a 0 to the right of a 1 in a valid thermometer code. The low TH(X+1) applied to the other OR input of AND-OR gates 74, 73, 72, 71 causes both OR inputs to be low, forcing the gates of n-channel transistors 54, 53, 53, 51 to go low, disconnecting all of binary-weighted capacitors 60, 61, 62, 63, 64 from adding their capacitance to summing node S, since their bottom plates are floating and disconnected from ground.

When the thermometer code bit THX is 1, and TH(X+1) is also 1, then the binary-weighted switched capacitor array 70 is an "on" cell. This is not the selected cell for the leading 1 in the thermometer code, but is a cell for a trailing 1.

THX high turns on transistor 50, connecting capacitor 60. The high TH(X+1) applied to the OR input of AND-OR gates 74, 73, 72, 71 forces high the outputs of AND-OR gates 74, 73, 72, 71, turning on n-channel transistors 54, 53, 53, 51. All of binary-weighted capacitors 60, 61, 62, 63, 64 are connected to ground and add their capacitance to summing node S.

Thus binary-weighted switched capacitor array 70 can operate in one of three modes. First, as an "on" cell wherein all binary-weighted capacitors 60, 61, 62, 63, 64 are enabled and add their capacitances to summing node S. Second, as an "off" cell wherein none of binary-weighted capacitors 60, 61, 62, 63, 64 add their capacitances to summing node S. Third, as the selected cell wherein the binary code determines which of binary-weighted capacitors 60, 61, 62, 63, 64 are connected to summing node S.

Figure 11:
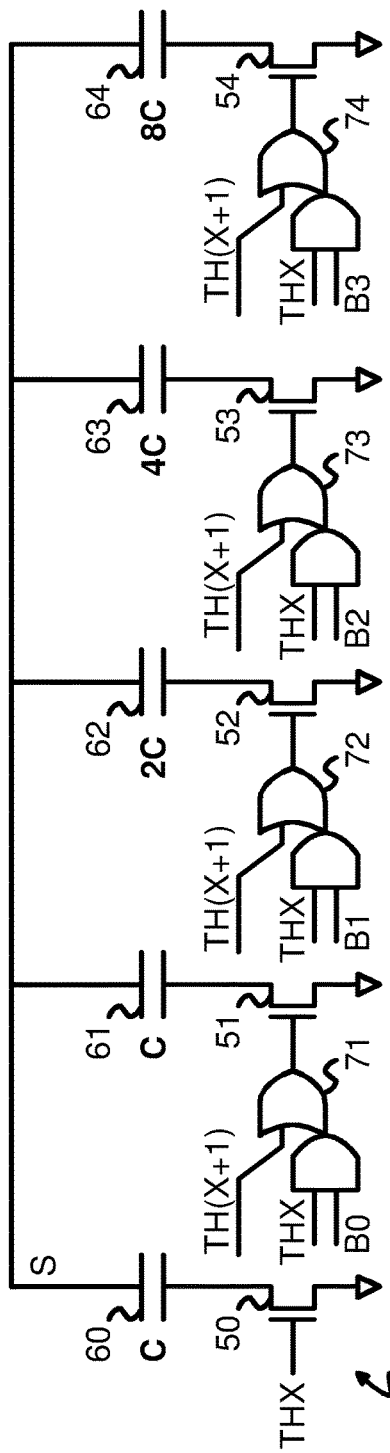
FIG. 11 highlights capacitance values produced by the binary code applied to the selected binary-weighted switched capacitor array.

FIG. 11 highlights capacitance values produced by the binary code applied to the selected binary-weighted switched capacitor array. When binary-weighted switched capacitor array 70 is the selected array for the leading 1 in the thermometer code, then THX is 1 and TH(X+1) is 0. The binary code B3:B0 passes through AND-OR gates 74, 73, 72, 71 to enable and disable binary-weighted capacitors 64, 63, 62, 61 through n-channel transistors 54, 53, 53, 51.

When all four binary bits are low, then only capacitor 60 with capacitance C is enabled, causing the total capacitance for binary-weighted switched capacitor array 70 to be C, the unit capacitance.

When B0 is high but B4, B3, B2 are low, then AND-OR gate 71 turns on transistor 51 to also enable capacitor 61 with capacitance C, so the total capacitance is 2C. When B3 is 1 but B0, B1, B2 are low, then AND-OR gate 74 enables capacitor 64 through transistor 54, while n-channel transistors 53, 53, 51 remain off. The total capacitance is the 8C capacitance of capacitor 64, plus the C capacitance of capacitor 60, for a total capacitance of 9C.

When B0 is low but B4, B3, B2 are high, then AND-OR gate 71 turns off transistor 51 to disable capacitor 61. The high B0, B1, B2 cause AND-OR gates 74, 73, 72 to enable capacitor, 64, 63, 62 through transistor 54, 53, 52. The total capacitance is the 8C capacitance of capacitor 64, plus the 4C capacitance of capacitor 63, plus the 2C capacitance of capacitor 62, plus the C capacitance of capacitor 60, for a total capacitance of 15C.

When binary-weighted switched capacitor array 70 is an "on" cell, THX is 1 and TH(X+1) is 1, so all of binary-weighted capacitors 60, 61, 62, 63, 64 are enabled. The total capacitance is 16C. Thus the binary-weighted switched capacitor array 70 counts from 1C up to 16C, and then remains at 16C as the binary code increases and the thermometer code increases to select the next more-significant binary-weighted switched capacitor array 70 as the selected cell.

Figure 12:
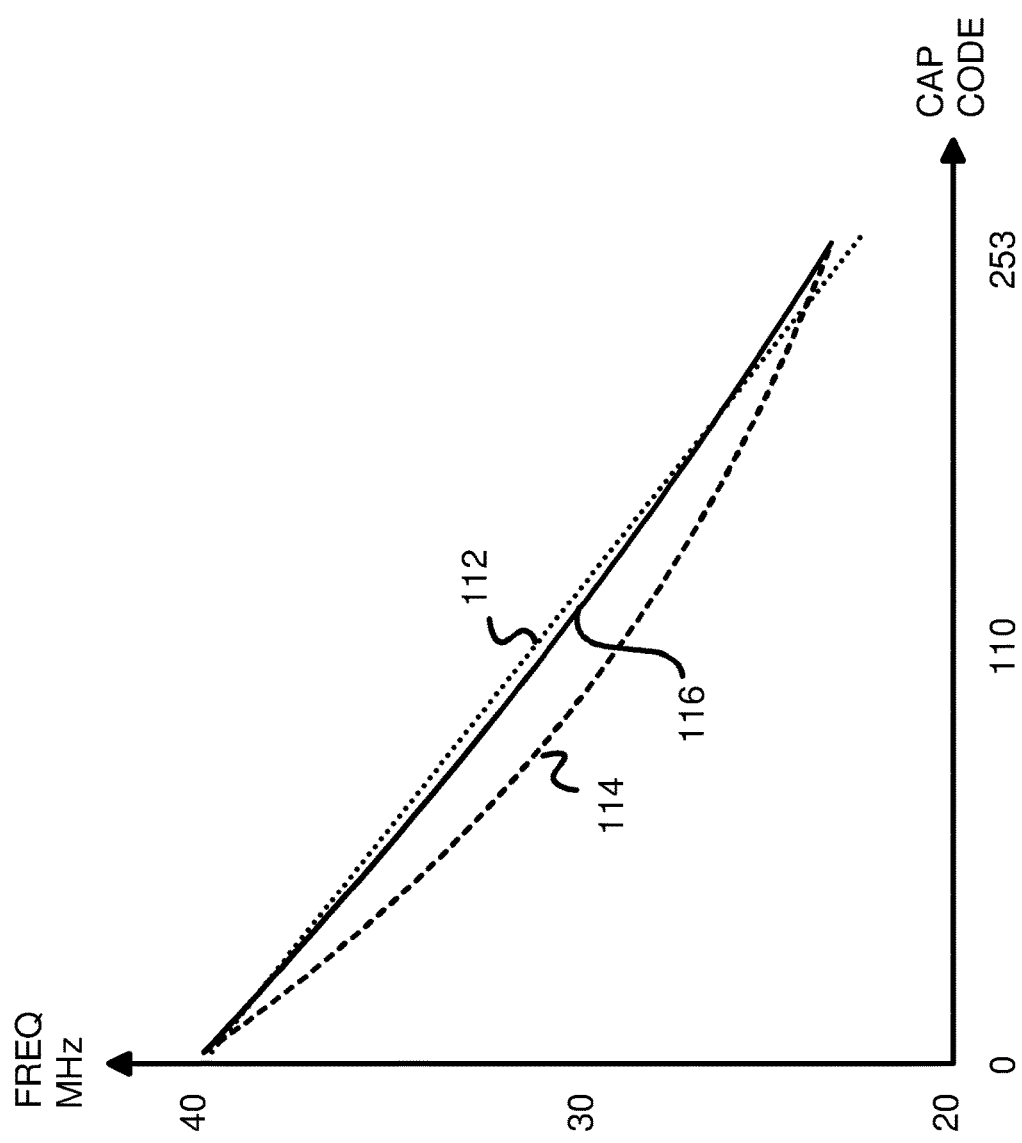
FIG. 12 is a graph showing improvement in frequency linearity using the reciprocal-compensating binary-weighted switched capacitor arrays of FIGS. 4-11.

FIG. 12 is a graph showing improvement in frequency linearity using the reciprocal-compensating binary-weighted switched capacitor arrays of FIGS. 4-11. Curve 114 shows a conventional oscillator where the frequency is proportional to 1/RC. The capacitor code increases the total capacitance using binary-weighted increments. This causes curve 114 to deviate significantly from the ideal linear line 112.

Using the reciprocal-compensating binary-weighted switched capacitor arrays of FIGS. 4-11 results in curve 116, which is much closer to ideal linear line 112. A (p,n)-bit binary code has the upper p binary bits decoded into an m-bit thermometer code, where $2^p=m$. The unit capacitance of each binary-weighted switched capacitor array 70 is adjusted to compensate for the non-linear relationship of frequency and capacitance. Good linearity and monotonicity is achieved.

Figure 13:
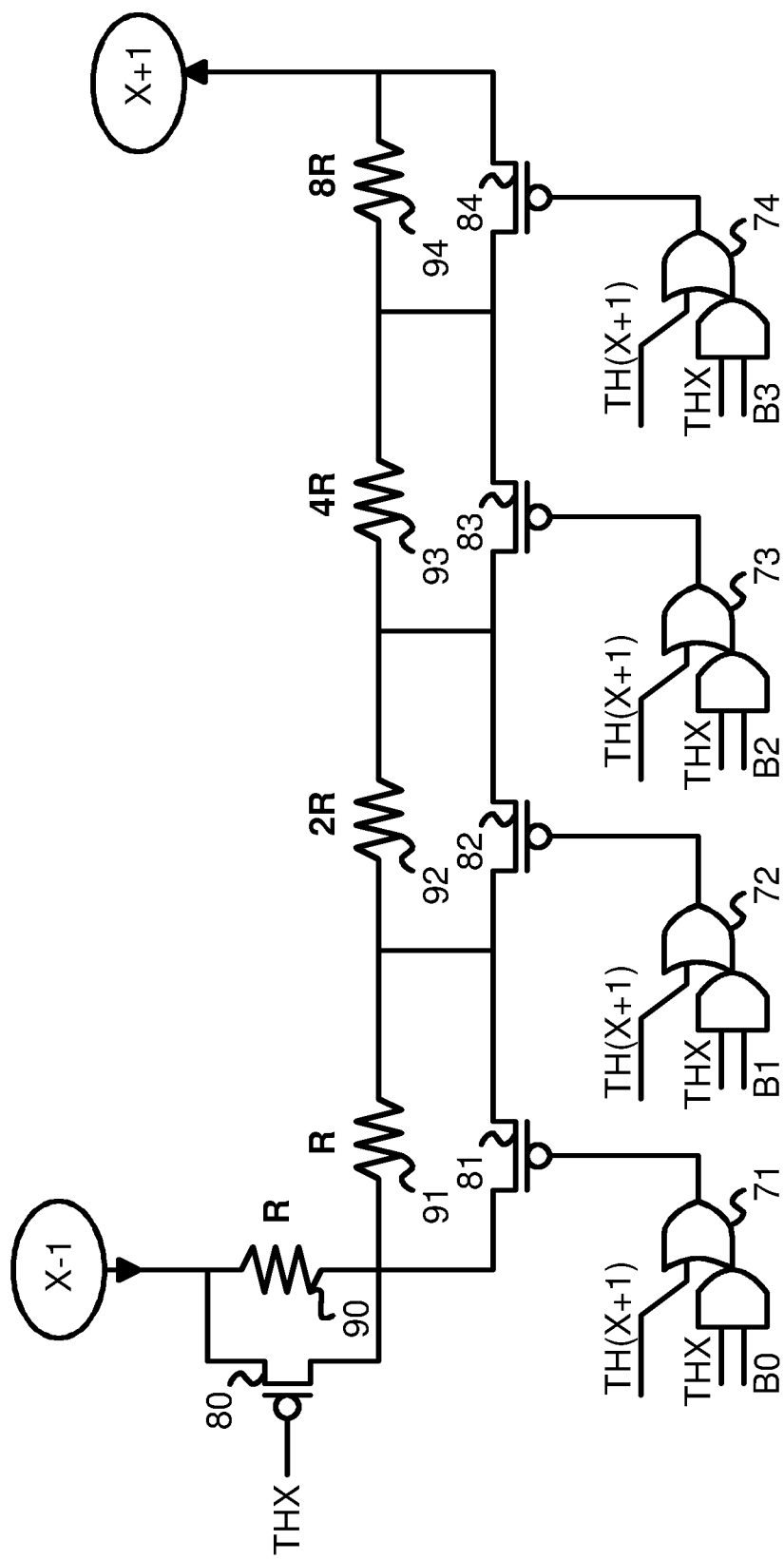
FIG. 13 shows a binary-weighted switched resistor array.

FIG. 13 shows a binary-weighted switched resistor array. As an alternative, a fixed capacitor can be used with a variable resistor to implement the oscillator of FIG. 4. The variable resistor can replace resistor 30 of FIG. 4. Variable capacitor 26 may be deleted.

AND-OR gates 74, 73, 72, 71 operate as described for FIGS. 10-11 to drive high signals to the gates of p-channel transistors 84, 83, 82, 81, causing them to turn off and force current through resistors 94, 93, 92, 91, increasing the series resistance by 8R, 4R, 2R, and R, respectively, wherein R is the unit resistance of the binary-weighted switched resistor array. The inverse of THX is applied to the gate of p-channel transistor 80 to bypass resistor 90 when the thermometer code is 1 for this array cell. Resistor 90 connects to the prior, less-significant binary-weighted switched resistor array cell while resistor connects in series to the next, more-significant binary-weighted switched resistor array cell. The unit resistance of each binary-weighted switched resistor array is adjusted to compensate for the non-linear relationship of frequency being proportional to 1/RC. Thus each binary-weighted switched resistor array has a different unit resistance R.

Alternate Embodiments

Several other embodiments are contemplated by the inventors. For example the entire circuit can be flipped, n-channel and p-channel transistors can be swapped, and the back terminal of the capacitors can be connected to power or to another voltage rather than to ground.

More precise capacitance values may be substituted by using more significant digits for the unit capacitance values. The unit capacitance values may be scaled. Also, different unit capacitances may be substituted, such as for different frequency ranges, different values of m and n bits, and for different processes and operating conditions or environments.

The theoretical operation of the circuit as currently understood is shown by the following equations. Actual operation may include secondary effects that are not included in these simple equations, especially for smaller device sizes.

Since at steady state the two inputs of op amp 20 (FIG. 4) are equal voltages Vref, the current I through resistor 30 is:

$$I=Vref/R$$

where R is the resistance of resistor 30. This is also the current through transistors 38, 40 when they are the same size (1:1 scaling). The time constant T for charging the total capacitance C on the summing node S using this current I through transistor 40 is $$T=CVref/I=C*Vref/(Vref/R)=RC$$

Then the output frequency f is:

$$f=1/T=1/RC$$

The unit capacitance can be calculated from the resistance R and the frequency at the beginning and ending of a frequency interval covered by a binary-weighted switched capacitor array 70. The overall frequency range is divided into m frequency intervals, where m is the number of binary-weighted switched capacitor arrays 70 and also the number of thermometer bits. Each binary-weighted switched capacitor array 70 covers one of these frequency intervals, from F1 to F2, where F2 is the highest frequency in the interval and F1 is the smallest frequency in the interval. The total capacitance TC12 of binary-weighted switched capacitor array 70 for the interval from F1 to F2 is:

$$TC12=1/(R*F1)-1/(R*F2)$$

The unit capacitance UC12 is $\frac{1}{2}^n$ of the total capacitance for n binary bits, so the unit capacitance is:

$$TC12/2^n$$

or $$UC12=[1/(R*F1)-1/(R*F2)]/2^n$$

This formula can be used to calculate the unit capacitance for each of the m binary-weighted switched capacitor arrays 70.

For example, a capacitor code word has in total 7 binary bits, with the top 3 p binary bits decoded into 8 thermometer code bits, and the remaining 4 binary bits being the binary code to binary-weighted switched capacitor array 70. Since there are 8 thermometer bits, there are 8 binary-weighted switched capacitor arrays 70, one selected by each thermometer code bit.

It is desired to cover the frequency range from 25.6 to 38.4 MHz. This frequency range is divided into 8 frequency intervals, each being 1.6 MHz wide. The first range is from 38.4 to 36.8 MHz, the second range is from 36.8 to 35.2 MHz, . . . and the eight range from 27.2 to 25.6 MHz.

Using the above formula, with F1 always being the smaller of the two endpoints of a frequency interval, and assuming a resistance R of 30 k-Ohm, the first interval from 38.4 to 36.8 MHz has a total capacitance of 38 fF. When this total capacitance is divided by $2^n$ or 16, for n=4 binary bits, the unit capacitance is 2.4 fF for the first binary-weighted switched capacitor array 70.

The second interval from 36.8 to 35.2 MHz has a total capacitance of 41 fF. When this total capacitance is divided by $2^n$ or 16, the unit capacitance is 2.6 fF for the second binary-weighted switched capacitor array 70.

The third interval from 35.2 to 33.6 MHz has a total capacitance of 45 fF. When this total capacitance is divided by $2^n$ or 16, the unit capacitance is 2.8 fF for the third binary-weighted switched capacitor array 70.

These calculations of the unit capacitance produce unit capacitances of 3.1, 3.4, 3.8, and 4.25 fF for the fourth through seventh frequency intervals.

The eighth and final interval from 27.2 to 25.6 MHz has a total capacitance of 77 fF. When this total capacitance is divided by $2^n$ or 16, the unit capacitance is 4.8 fF for the eighth binary-weighted switched capacitor array 70, the LSB of the thermometer code.

These unit capacitances for the 8 binary-weighted switched capacitor arrays 70 are also shown in FIG. 8.

There is also a fixed capacitor 27 (FIG. 4) in parallel with variable capacitor 26. The eight binary-weighted switched capacitor arrays 70 form variable capacitor 26. However, an additional fixed capacitance is needed to set the oscillator output frequency to the desired starting frequency of 38.4 MHz. This fixed capacitance is calculated from F=1/RC to obtain 868 fF when using a 30 k-Ohm resistor.

The resistance R determines the charging current. Approximate values may be used in these calculations, and device sizes such as for the unit capacitance may be rounded off. For example, values within 5% or 10% may be sufficiently accurate for approximate compensation for the reciprocal function. The variable resistor may replace resistor 30 of FIG. 4.

An extra leading thermometer bit can be added. This leading thermometer bit is set to 0, and is used as the TH(X+1) bit to the most-significant binary-weighted switched capacitor array 70. This can be a dummy bit that is always grounded. Alternately, the LSB thermometer code bit is usually a 1, unless the capacitors are all turned off, so the LSB thermometer code bit could be a dummy bit or could be deleted.

Bits may be inverted. For example, the thermometer code may have all bits inverted, and the leading 0 position rather than the leading 1 position identifies the selected binary-weighted switched capacitor array. The binary code could also be inverted, or another code such as a gray code could be substituted for the binary code. The upper bits of the code word could initially be in binary format and then decoded for form the thermometer code bits. Many other variations and codings are possible.

Many examples and values may be substituted. The unit capacitance values for the example of FIG. 8 assume a frequency range from 25.6 to 38.4 MHz, and a resistance of 30 k-ohm. This example also assumes 4 binary bits and 3 binary bits converted to an 8-bit thermometer code. Each binary-weighted switched capacitor array 70 covers a range of 1.6 MHz.

The number of binary bits could be more or less than 4, and the number of thermometer code bits could be more than or less than the 8 in the example. More bits for a set frequency range provide for smaller unit capacitances and better accuracy. The designer may choose values of m and n for a particular desired frequency range, and then select a value for R before calculating unit capacitances. This design process may be repeated iteratively until a best set or parameters is obtained.

Rather than use AND-OR gates 74, 73, 72, 71, other logic may be used, such as discrete NAND, NOR, and inverters, programmable logic, or a more complex controller, either programmed or hardwired. The control logic for different binary-weighted switched capacitor arrays 70 can be separate as shown earlier, or may be partially or fully combined or integrated. The actual gates may be computer-generated by design-and-place software tools, with the designer merely inputting the desired logic equations or behavior using a behavioral design language.

Other circuit arrangements are also possible, such as having both a variable resistor and variable capacitor 26, or using different RC circuit networks. Charging and discharging currents may be positive or negative, and flow in either direction. Many alternatives to the current-mirror and feedback circuits of FIG. 4 are possible. Additional devices and circuits may be added for temperature, process, and supply voltage tracking, and for power down or power savings modes. Tuning and initialization circuits may also be added.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A compensating oscillator comprising:
a summing node that is charged using a resistance;
a comparison buffer that toggles an output when the summing node crosses a target;
a variable capacitor coupled to connect a variable capacitance to the summing node, the variable capacitance selectable using a code word having an upper m bits and a lower n bits;
wherein the upper m bits comprise a thermometer code, and wherein the lower n bits comprise a binary code;
a discharge device, receiving the output, for discharging the summing node in response to the output;
wherein the variable capacitor comprises:
a plurality of binary-weighted switched capacitor arrays, wherein each binary-weighted switched capacitor array in the plurality of binary-weighted switched capacitor array is selected by a bit in the thermometer code of the upper m bits;
wherein each binary-weighted switched capacitor array in the plurality of binary-weighted switched capacitor arrays comprises:
a plurality switched capacitors having capacitances that are binary multiples of a unit capacitance of a smallest switched capacitor in the binary-weighted switched capacitor array;
a plurality of switches, each switch in the plurality of switches enabling one of the plurality of switched capacitors to connect to the summing node; and
a plurality of control gates that control the plurality of switches;
wherein when the binary-weighted switched capacitor array is identified by a leading 1 bit in the thermometer code, the plurality of control gates uses the binary code of the lower n bits to select the plurality of switched capacitors to connect to the summing node, wherein each binary bit of the lower n bits of the binary code control a different one of the plurality of switched capacitors having a binary weight identified by a binary bit of the binary code;
wherein when the binary-weighted switched capacitor array is identified by a 1 bit in the thermometer code that is not the leading 1 bit in the thermometer code, the plurality of control gates connects all of the plurality of switched capacitors to the summing node regardless of the binary code;
wherein when the binary-weighted switched capacitor array is identified by a 0 bit in the thermometer code, the plurality of control gates disconnects all of the plurality of switched capacitors from the summing node regardless of the binary code;
wherein the unit capacitance of the smallest switched capacitor in each of the plurality of binary-weighted switched capacitor arrays is adjusted and not of equal value with the unit capacitance of other binary-weighted switched capacitor arrays in the plurality of binary-weighted switched capacitor arrays,
whereby unit capacitances are adjusted and not equal valued to provide compensation.

2. The compensating oscillator of claim 1 wherein the unit capacitance of each binary-weighted switched capacitor array is adjusted to compensate for a reciprocal relationship of a frequency of the output with the code word that selects the variable capacitance connected to the summing node.

3. The compensating oscillator of claim 1 wherein the unit capacitance of each binary-weighted switched capacitor array is adjusted to compensate by increasing the unit capacitance sufficiently to cause a frequency of the output to intersect an ideal linear line in a graph of output frequency with a fully binary value of the code word when the lower n bits are all zeros;
wherein the thermometer code is converted to a binary value for the fully binary value of the code word.

4. The compensating oscillator of claim 3 wherein the unit capacitance of each binary-weighted switched capacitor array is adjusted to compensate for a reciprocal relationship by increasing the unit capacitance by a larger increase for each successive binary-weighted switched capacitor array in the plurality of binary-weighted switched capacitor arrays,
whereby adjustments in the unit capacitance increase for successive binary-weighted switched capacitor arrays.

5. The compensating oscillator of claim 4 wherein the unit capacitance of a most-significant binary-weighted switched capacitor array in the plurality of binary-weighted switched capacitor arrays is at least double the unit capacitance of a least-significant binary-weighted switched capacitor array in the plurality of binary-weighted switched capacitor arrays.

6. The compensating oscillator of claim 4 wherein a unit capacitance UC for a binary-weighted switched capacitor is determined by a formula $UC=[1/(R*F1)-1/(R*F2)]/2^n$, wherein R is an effective resistance to charge the variable capacitor and n is a number of binary bits for the lower n bits, and F1 is a minimum output frequency generated and F2 is a maximum output frequency generated when the binary-weighted switched capacitor array is identified by a leading 1 bit in the thermometer code;
and wherein the unit capacitances are within 10% of a value calculated by the formula.

7. The compensating oscillator of claim 1 wherein m comprises at least 8 thermometer bits;
wherein the plurality of binary-weighted switched capacitor arrays comprises at least 8 binary-weighted switched capacitor arrays;
wherein the unit capacitance has at least 8 different values for the at least 8 binary-weighted switched capacitor arrays.

8. The compensating oscillator of claim 1 wherein n comprises at least 4 binary bits;

wherein the plurality of switched capacitors comprises at least four switched capacitors having binary-weighted capacitances of one, two, four, and eight times the unit capacitance.

9. The compensating oscillator of claim 8 wherein the plurality of switched capacitors comprises two switched capacitors each having the unit capacitance.

10. The compensating oscillator of claim 9 wherein the binary-weighted switched capacitor array comprises:
a first switched capacitor having the unit capacitance that is connected to the summing node through a first transistor that conducts when a thermometer code bit that selects the binary-weighted switched capacitor array is a one;
a second switched capacitor having the unit capacitance that is connected to the summing node through a second transistor that conducts in response to an output of a second control gate;
a third switched capacitor having double the unit capacitance that is connected to the summing node through a third transistor that conducts in response to an output of a third control gate;
a fourth switched capacitor having four times the unit capacitance that is connected to the summing node through a fourth transistor that conducts in response to an output of a fourth control gate; and
a fifth switched capacitor having eight times the unit capacitance that is connected to the summing node through a fifth transistor that conducts in response to an output of a fifth control gate.

11. The compensating oscillator of claim 10 wherein the binary-weighted switched capacitor array further comprises:
a second control gate that drives a least-significant bit of the binary code to control a gate of the second transistor when the thermometer code bit that selects the binary-weighted switched capacitor array is a one and a next-most-significant thermometer code bit is a zero;
wherein the next-most-significant thermometer code bit is for selecting a next-most-significant binary-weighted switched capacitor array;
the second control gate disabling the gate of the second transistor when the thermometer code bit that selects the binary-weighted switched capacitor array is a zero;
the second control gate enabling the gate of the second transistor when next-most-significant thermometer code bit is a one;
a third control gate that drives a second least-significant bit of the binary code to control a gate of the third transistor when the thermometer code bit that selects the binary-weighted switched capacitor array is a one and a next-most-significant thermometer code bit is a zero;
the third control gate disabling the gate of the third transistor when the thermometer code bit that selects the binary-weighted switched capacitor array is a zero;
the third control gate enabling the gate of the third transistor when next-most-significant thermometer code bit is a one;
a fourth control gate that drives a least-significant bit of the binary code to control a gate of the fourth transistor when the thermometer code bit that selects the binary-weighted switched capacitor array is a one and a next-most-significant thermometer code bit is a zero;
the fourth control gate disabling the gate of the fourth transistor when the thermometer code bit that selects the binary-weighted switched capacitor array is a zero;
the fourth control gate enabling the gate of the fourth transistor when next-most-significant thermometer code bit is a one;
a fifth control gate that drives a least-significant bit of the binary code to control a gate of the fifth transistor when the thermometer code bit that selects the binary-weighted switched capacitor array is a one and a next-most-significant thermometer code bit is a zero;
the fifth control gate disabling the gate of the fifth transistor when the thermometer code bit that selects the binary-weighted switched capacitor array is a zero;
the fifth control gate enabling the gate of the fifth transistor when next-most-significant thermometer code bit is a one.

12. A variable oscillator comprising:
a variable impedance that determines a variable time constant;
a driver, coupled to the variable impedance, that drives a clock having an output frequency that is determined by the variable time constant;
a control word that controls the variable impedance to adjust the output frequency, the control word having upper bits that are representable by a thermometer code, and lower bits that are a binary code;
a plurality of binary-weighted switched impedance arrays, each having a unit impedance device that has a unit impedance, and having switched impedance devices having impedance values that are one, two, four, and eight times the unit impedance value;
a plurality of switches in each of the plurality of binary-weighted switched impedance arrays, for enabling and disabling the switched impedance devices using the binary code when a binary-weighted switched impedance array is selected by having a corresponding thermometer code that is a leading 1, wherein no other more-significant binary-weighted switched impedance arrays have a corresponding thermometer code bit with a 1 value; and
control logic in each of the plurality of binary-weighted switched impedance arrays, the control logic disabling all switched impedance devices in a binary-weighted switched impedance array that is turned off by having a corresponding thermometer code bit with a 0 value, the control logic enabling all switched impedance devices in a binary-weighted switched impedance array that is turned on by having a corresponding thermometer code bit with a 1 value that is not the leading 1;
wherein each of the plurality of binary-weighted switched impedance arrays has a different impedance value for the unit impedance,
whereby non-identical unit impedance values are switched in each of the plurality of binary-weighted switched impedance arrays that are controlled by the thermometer code.

13. The variable oscillator of claim 12 wherein the unit impedance has a minimum value for a least-significant binary-weighted switched impedance array that is controlled by a least-significant thermometer code bit in the thermometer code;
wherein the unit impedance has a maximum value for a most-significant binary-weighted switched impedance array that is controlled by a most-significant thermometer code bit in the thermometer code;
wherein the unit impedance monotonically increases for successive binary-weighted switched impedance array.

14. The variable oscillator of claim 13 wherein the unit impedance monotonically increases by a larger amount for each successive binary-weighted switched impedance array, whereby larger increases in the unit impedance occur for more-significant binary-weighted switched impedance arrays.

15. The variable oscillator of claim 13 wherein unit impedances are increased by an amount that is sufficient to intersect a line on a graph of the output frequency as a function of the control word when the binary code in the control word is all zeros.

16. The variable oscillator of claim 12 wherein the switched impedance devices are capacitors.

17. The variable oscillator of claim 12 wherein the switched impedance devices are resistors.

18. The variable oscillator of claim 17 wherein the resistors are connected in series;
wherein the plurality of switches comprise transistors that each bypass a resistor to disable a switched impedance device.

19. A RC oscillator comprising:
an op amp that compares a summing node to a reference to generate an output;
a variable capacitor connected to the summing node;
a discharge transistor having a gate controlled by feedback from the output, for discharging the summing node;
a charging device that charged the variable capacitor thorough the summing node;
an input code word that controls a total capacitance of the variable capacitor, the input code word having Most-Significant-Bits (MSBs) that are decoded to form a thermometer code, and Least-Significant-Bits (LSBs) that are a binary code;
a plurality of binary-weighted switched capacitor array cells, each cell enabled, disabled, or selected by a corresponding bit in the thermometer code;
a plurality of binary-weighted switched capacitors in each cell, having switchable capacitances that are a unit capacitance, double the unit capacitance, and four times the unit capacitance;
a plurality of switches in each cell, each switch for enabling or disabling connection to the summing node of a switched capacitor in the plurality of binary-weighted switched capacitors;
control logic in each cell, the control logic for enabling all of the plurality of switches in a cell having a corresponding bit in the thermometer code that has a 1 value but is not a leading 1, and for disabling all of the plurality of switches in a cell having a corresponding bit in the thermometer code that has a 0 value, and for using the binary code to enable and disable switches in the plurality of switches in a cell having a corresponding bit in the thermometer code that has a 1 value and is also the leading 1 in the thermometer code;
wherein the unit capacitance monotonically increases from cell to cell to compensate for a non-linear relationship of a frequency of the output to the input code word.

20. The RC oscillator of claim 19 wherein the unit capacitance (UC) for a binary-weighted switched capacitor is determined by the formula $UC=[1/(R*F1)-1/(R*F2)]/2^n$, wherein R is an effective resistance of the charging device, n is a number of binary bits in the binary code, and F1 is a minimum output frequency generated and F2 is a maximum output frequency generated when the binary-weighted switched capacitor array cell is identified by a leading 1 bit in the thermometer code;
and wherein the unit capacitances are within 10% of a value calculated by the formula.

* * * * *